(12) United States Patent
Ko et al.

(10) Patent No.: US 8,803,597 B2
(45) Date of Patent: Aug. 12, 2014

(54) SEMICONDUCTOR INTEGRAGED CIRCUIT HAVING COMPATIBLE MODE SELECTION CIRCUIT

(71) Applicant: SK hynix Inc., Gyeonggi-do (KR)

(72) Inventors: Jae-Bum Ko, Gyeonggi-do (KR); Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/717,064

(22) Filed: Dec. 17, 2012

(65) Prior Publication Data

US 2013/0321074 A1    Dec. 5, 2013

(30) Foreign Application Priority Data

May 31, 2012    (KR) .................. 10-2012-0058605

(51) Int. Cl.
    *H01L 25/00*    (2006.01)
(52) U.S. Cl.
    USPC ........................................................ 327/565
(58) Field of Classification Search
    USPC ...................... 327/407, 408, 564, 565, 566
    See application file for complete search history.

(56) References Cited

U.S. PATENT DOCUMENTS

| 5,261,115 | A  | * | 11/1993 | Saunders et al. | ............... 710/104 |
| 6,271,587 | B1 | * | 8/2001  | Patti            | ...................... 257/724 |
| 7,286,384 | B2 | * | 10/2007 | Wendt et al.     | ........................ 365/63 |
| 7,701,045 | B2 | * | 4/2010  | Ware et al.      | .................... 257/686 |
| 8,269,521 | B2 | * | 9/2012  | Wu               | ...................... 326/21 |
| 8,417,864 | B2 | * | 4/2013  | Sun et al.       | .................... 710/301 |

FOREIGN PATENT DOCUMENTS

| KR | 1020060065793 | 6/2006 |
| KR | 1020080108975 | 12/2008 |
| KR | 1020090053151 | 5/2009 |
| KR | 100905816     | 7/2009 |
| KR | 1020120080360 | 7/2012 |

* cited by examiner

*Primary Examiner* — Jeffrey Zweizig
(74) *Attorney, Agent, or Firm* — IP & T Group LLP

(57) ABSTRACT

A semiconductor integrated circuit includes a semiconductor chip or a plurality of semiconductor chip stacked therein, wherein each semiconductor chip includes, a compatible mode selection unit configured to select a chip allocation signal allocated to the semiconductor chip, among a plurality of chip allocation signals inputted through a plurality of pads, in response to a stack package information, and an internal circuit configured to perform a given operation in response to the chip allocation signal selected by the compatible mode selection unit.

16 Claims, 14 Drawing Sheets

SEMICONDUCTOR INTEGRAGED CIRCUIT HAVING COMPATIBLE MODE SELECTION CIRCUIT

CROSS-REFERENCE TO RELATED APPLICATIONS

The present application claims priority of Korean Patent Application No. 10-2012-0058605, filed on May 31, 2012, which is incorporated herein by reference in its entirety.

BACKGROUND

1. Field

Exemplary embodiments of the present invention relate to a semiconductor design technology, and more particularly, to a semiconductor integrated circuit having a mode selection circuit compatible for diverse package types.

2. Description of the Related Art

Recently, a semiconductor integrated circuit such as Dynamic Random Access Memory (DRAM) includes a plurality of semiconductor chips (or dies) that are stacked and packaged to obtain a larger capacity in the same area. Meanwhile, a semiconductor integrated circuit having a single semiconductor chip packaged is referred to as a single die package (SDP), a semiconductor integrated circuit having two semiconductor chips stacked and packaged is referred to as a dual die package (DDP), and a semiconductor integrated circuit having four semiconductor chips stacked and packaged is referred to as a quad die package (QDP).

FIG. 1 is a configuration diagram illustrating an interface structure of a conventional SDP. FIG. 2 is a configuration diagram illustrating an interface structure of a conventional DDP.

Referring to FIG. 1, a semiconductor chip 10 included in the SDP includes an internal circuit 12 configured to perform given operations according to a first chip select signal CS0#, a first clock enable signal CKE0, a first on-die termination (ODT) control signal ODT0, and a first ZQ calibration control signal ZQ0. Address signals ADD<15:0>, command signals RAS#, CAS#, and WE#, and data DQ<7:0> are also inputted to the internal circuit 12 for the given operations.

Here, the first chip select signal CS0#, the first clock enable signal CKE0, the first ODT control signal ODT0, and the first ZQ calibration control signal ZQ0 are inputted through corresponding pads. Furthermore, another pads for inputting a second chip select signal CS1#, a second clock enable signal CKE1, a second ODT control signal ODT1, and a second ZQ calibration control signal ZQ1 are reserved.

Referring to FIG. 2, the DDP includes a first semiconductor chip 20 and a second semiconductor chip 30, which are stacked vertically. The first semiconductor chip 20 includes a first internal circuit 22 configured to perform given operations based on a first chip select signal CS0#, a first clock enable signal CKE0, a first ODT control signal ODT0, and a first ZQ calibration control signal ZQ0. The second semiconductor chip 30 includes a second internal circuit 32 configured to perform given operations based on a second chip select signal CS1#, a second clock enable signal CKE1, a second ODT control signal ODT1, and a second ZQ calibration control signal ZQ1.

Here, the first chip select signal CS0#, the first clock enable signal CKE0, the first ODT control signal ODT0, and the first ZQ calibration control signal ZQ0 are directly inputted to the first semiconductor chip 20. On the other hand, the second chip select signal CS1#, the second clock enable signal CKE1, the second ODT control signal ODT1, and the second ZQ calibration control signal ZQ1 are transmitted to the second semiconductor chip 30 through the first semiconductor chip 20. Furthermore, the second chip select signal CS1#, the second clock enable signal CKE1, the second ODT control signal ODT1, and the second ZQ calibration control signal ZQ1 are transmitted through signal lines twisted in the first semiconductor chip 20, when the signals are transmitted from the first semiconductor chip 20 to the second semiconductor chip 30. The respective signals CS1#, CKE1, ODT1, and ZQ1 are inputted to corresponding pads provided in the second semiconductor chip 30.

FIG. 3 is a configuration diagram illustrating an interface structure of another conventional DDP (3DS DDP).

Referring to FIG. 3, the 3DS DDP includes a first semiconductor chip 40 and a second semiconductor chip 50, which are stacked vertically. The first semiconductor chip 40 includes a first internal circuit 42 configured to perform given operations based on a first chip select signal CS0#, a first clock enable signal CKE0, a first ODT control signal ODT0, and a first ZQ calibration control signal ZQ0. The second semiconductor chip 50 includes a second internal circuit 52 configured to perform given operations based on a second chip select signal CS1#, the first clock enable signal CKE0, the first ODT control signal ODT0, and a second ZQ calibration control signal ZQ1.

Here, the first chip select signal CS0#, the first clock enable signal CKE0, the first ODT control signal ODT0, and the first. ZQ calibration control signal ZQ0 are directly inputted to the first semiconductor chip 40. On the other hand, the second chip select signal CS1#, the first clock enable signal CKE0, the first. ODT control signal ODT0, and the second ZQ calibration control signal ZQ1 are transmitted to the second semiconductor chip 50 through the first semiconductor chip 40. Furthermore, the second chip select signal CS1# and the second ZQ calibration control signal ZQ1 are transmitted through signal lines twisted in the first semiconductor chip 40, when the signals are transmitted from the first semiconductor chip 40 to the second semiconductor chip 50. This is to input the second chip select signal CS1# and the second ZQ calibration control signal ZQ1 to corresponding pads provided in the second semiconductor chip 30. Meanwhile, the first clock enable signal CKE0 and the first ODT control signal ODT0 are transmitted through straight signal lines, when the signals are transmitted from the first semiconductor chip 40 to the second semiconductor chip 50. The first and second semiconductor chips 40 and 50 commonly use the first clock enable signal CKE0 and the first ODT control signal ODT0. Furthermore, the pads of the first and second semiconductor chip 40 and 50 corresponding to a second clock enable signal CKE1, a second ODT control signal ODT1 are reserved.

In the conventional DDP illustrated in FIG. 2, the chip select to signal, the clock enable signal, the ODT control signal, and the ZQ calibration control signal are inputted to each of the semiconductor chips. In the conventional 3DS DDP illustrated in FIG. 3, however, the chip select signal and the ZQ calibration control signal are inputted to each of the semiconductor chips, and the clock enable signal and the ODT control signal are inputted to the semiconductor chip group.

Meanwhile, the QDP (not illustrated in the FIGS. 1 to 3) may also have interface structures corresponding to various cases as in the DDPs illustrated in FIGS. 2 and 3.

However, since the semiconductor chips included in the SDP, the DDP, and the QDP having the above-described configurations have various interface connection structures, the semiconductor chips must be fabricated through different mask processes depending on package types SDP, DDP, and QDP and package designs. Thus, the productivity of the semiconductor chip fabrication process inevitably decreases.

SUMMARY

Exemplary embodiments of the present invention are directed to a semiconductor integrated circuit including semiconductor chips fabricated through the same mask process, regardless of package types, and a method for driving the same.

In accordance with an embodiment of the present invention, a semiconductor integrated circuit includes a semiconductor chip or a plurality of semiconductor chip stacked therein, wherein each semiconductor chip includes a compatible mode selection unit configured to select a chip allocation signal allocated to the semiconductor chip, among a plurality of chip allocation signals inputted through a plurality of pads, in response to a stack package information, and an internal circuit configured to perform a given operation in response to the chip allocation signal selected by the compatible mode selection unit.

In accordance with another embodiment of the present invention, a semiconductor integrated circuit includes a semiconductor chip or a plurality of semiconductor chip stacked therein, wherein each semiconductor chip includes a compatible mode selection unit configured to select a signal allocated to a group to which the semiconductor chip belongs, among a plurality of chip group allocation signals inputted through a plurality of pads, in response to chip grouping information, and an internal circuit configured to perform a given operation in response to the chip group allocation signal selected by the compatible mode selection unit.

In accordance with yet another embodiment of the present invention, a semiconductor integrated circuit includes a semiconductor chip or a plurality of semiconductor chip stacked therein, wherein the semiconductor chip includes, a first compatible mode selection unit configured to select a chip allocation signal allocated to the semiconductor chip, among a plurality of chip allocation signals inputted through a plurality of first pads, based on a first control signal, a second compatible mode selection unit configured to select a signal allocated to a group to which the semiconductor chip belongs, among a plurality of chip group allocation signals inputted through a plurality of second pads, based on a second control signal, an internal circuit configured to perform a given operation in response to the chip allocation signal selected by the first compatible mode selection unit and the chip group allocation signal selected by the second compatible mode selection unit, and a control signal generation unit configured to generate the first control signal corresponding to stack package information and the second control signal corresponding to chip grouping information.

DETAILED DESCRIPTION

Figure 1:
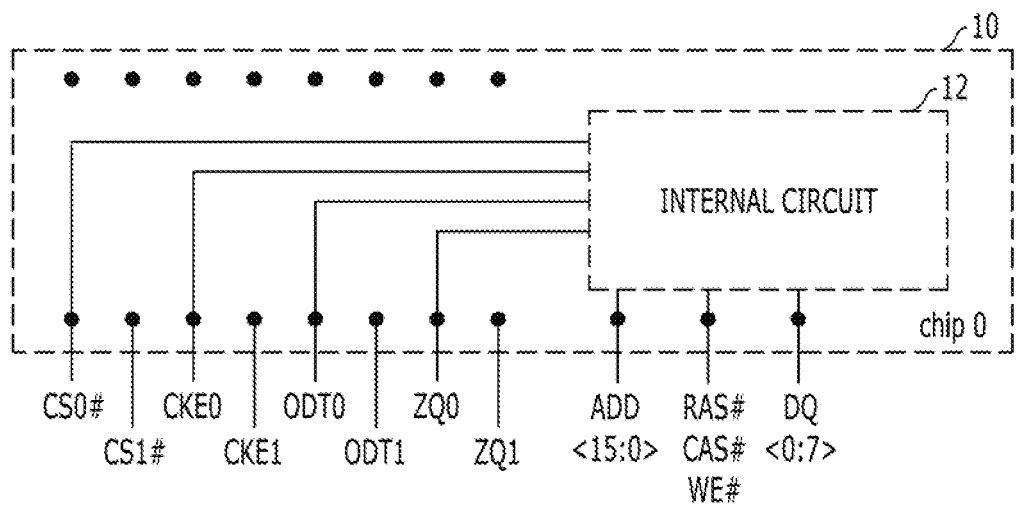
FIG. 1 is a configuration diagram illustrating an interface structure of a conventional SDP.
Figure 2:
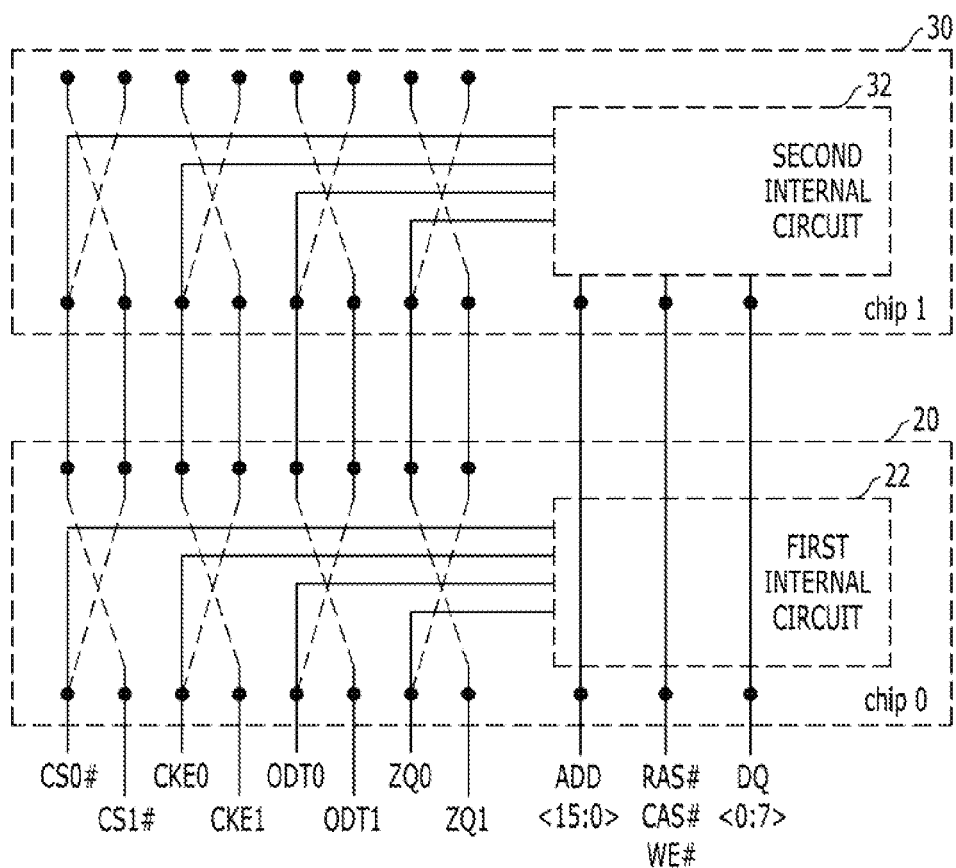
FIG. 2 is a configuration diagram illustrating an interface structure of a conventional DDP.
Figure 3:
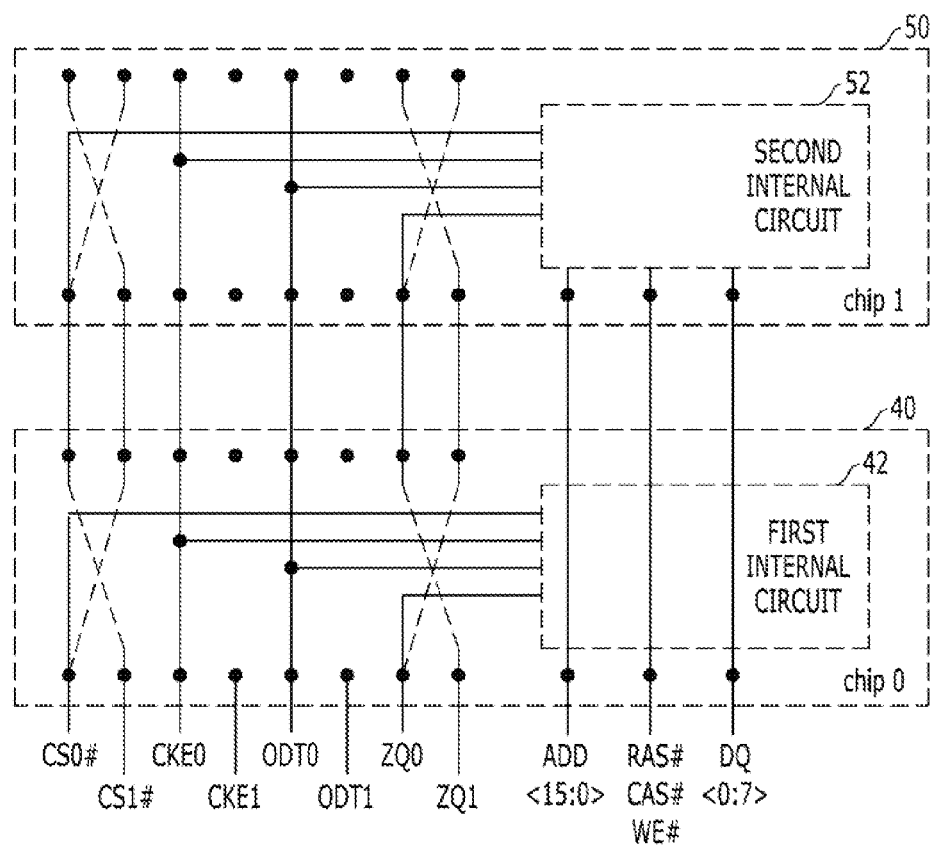
FIG. 3 is a configuration diagram illustrating an interface structure of another conventional DDP (3DS DDP).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, only the SDP, the DDP, and the QDP will be taken as examples, for convenience of description.

Figure 4:
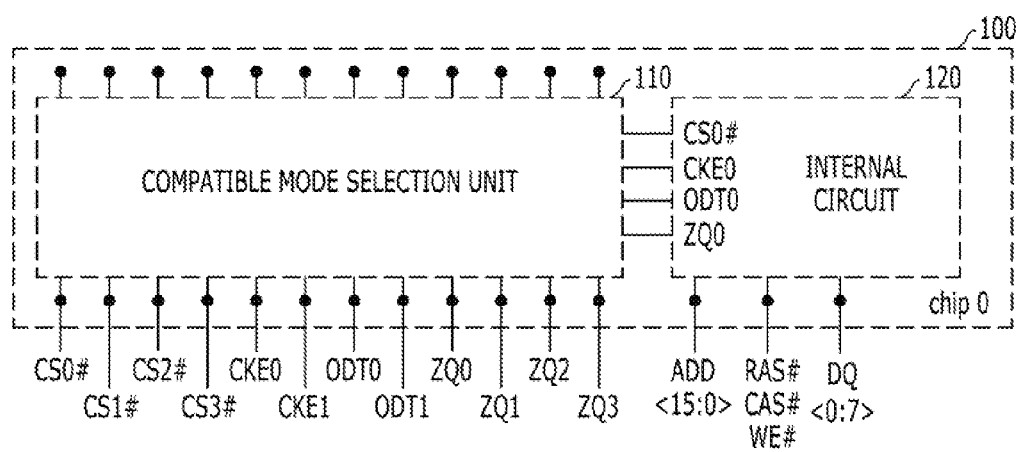
FIG. 4 is a configuration diagram illustrating an interface connection structure of an SDP in accordance with an embodiment of the present invention.

FIG. 4 is a configuration diagram illustrating an interface connection structure of at SDP in accordance with an embodiment of the present invention.

Referring to FIG. 4, the SDP includes one semiconductor chip 100. The semiconductor chip 100 includes a compatible mode selection unit 110 and an internal circuit 120. The compatible mode selection unit 110 is configured to selectively output only chip allocation signals CS0# and ZQ0 allocated to the semiconductor chip 100, among a plurality of chip allocation signals CS0# to CS3# and ZQ0 to ZQ3 inputted through corresponding pads, and selectively to output chip group allocation signals CKE0 and ODT0 allocated to the chip group to which the semiconductor chip 100 belongs, among a plurality of chip group allocation signals CKE0 to CKE1 and ODT0 to ODT1. The internal circuit 120 is configured to perform given operations in response to the chip allocation signals CS0# and ZQ0 and the chip group allocation signals CKE0 and ODT0, selected by the compatible mode selection unit 110.

Figure 5:
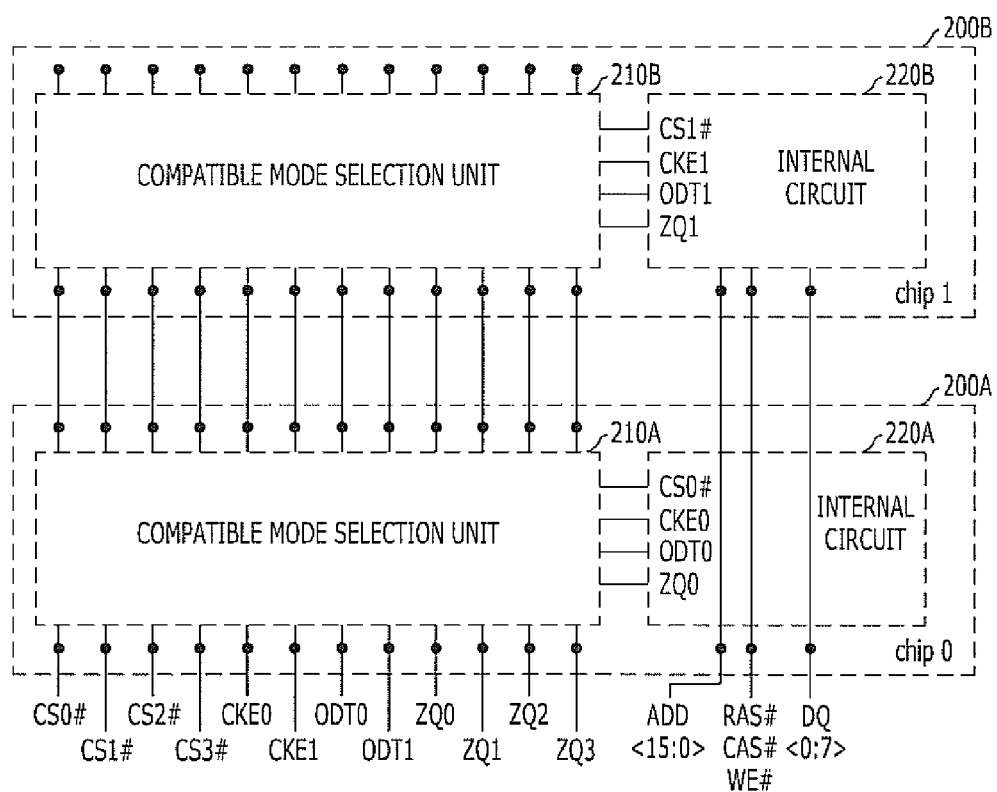
FIG. 5 is a configuration illustrating an interface connection structure of a DDP in accordance with the embodiment of the present invention.

FIG. 5 is a configuration illustrating an interface connection structure of a DDP in accordance with the embodiment of the present invention.

Referring to FIG. 5, the DDP includes a first semiconductor chip 200A connected to an external controller (not illustrated) and a second semiconductor chip 200B stacked over the first semiconductor chip 200A. The first and second semiconductor chips 200A and 200B include compatible mode selection units 210A and 210B and internal circuits 220A and 2206, respectively. The compatible mode selection units 210A and 210B are configured to selectively output only chip allocation signals allocated to the first and second semiconductor chips 200A and 200B, respectively, among a plurality of chip allocation signals CS0# to CS3# and ZQ0 to ZQ3 inputted through corresponding pads, and selectively output chip group allocation signals allocated to groups to which the first and second semiconductor chips 200A and 200B belong, respectively, among a plurality of chip group allocation signals CKE0 and CKE1 and ODT0 and ODT1 inputted through corresponding pads. The internal circuits 220A and 220B are configured to perform operations in response to the chip allocation signals and the chip group allocation signals, selected by the compatible mode selection units 210A and 2106, respectively. Here, the first semiconductor chip 200A transmits the plurality of chip allocation signals CS0# to CS3# and ZQ0 to ZQ3 and the plurality of chip group allocation signals CKE0, CKE1, ODT0, and ODT1, inputted through the corresponding pads, to corresponding pads of the second semiconductor chip 200B.

Figure 6:
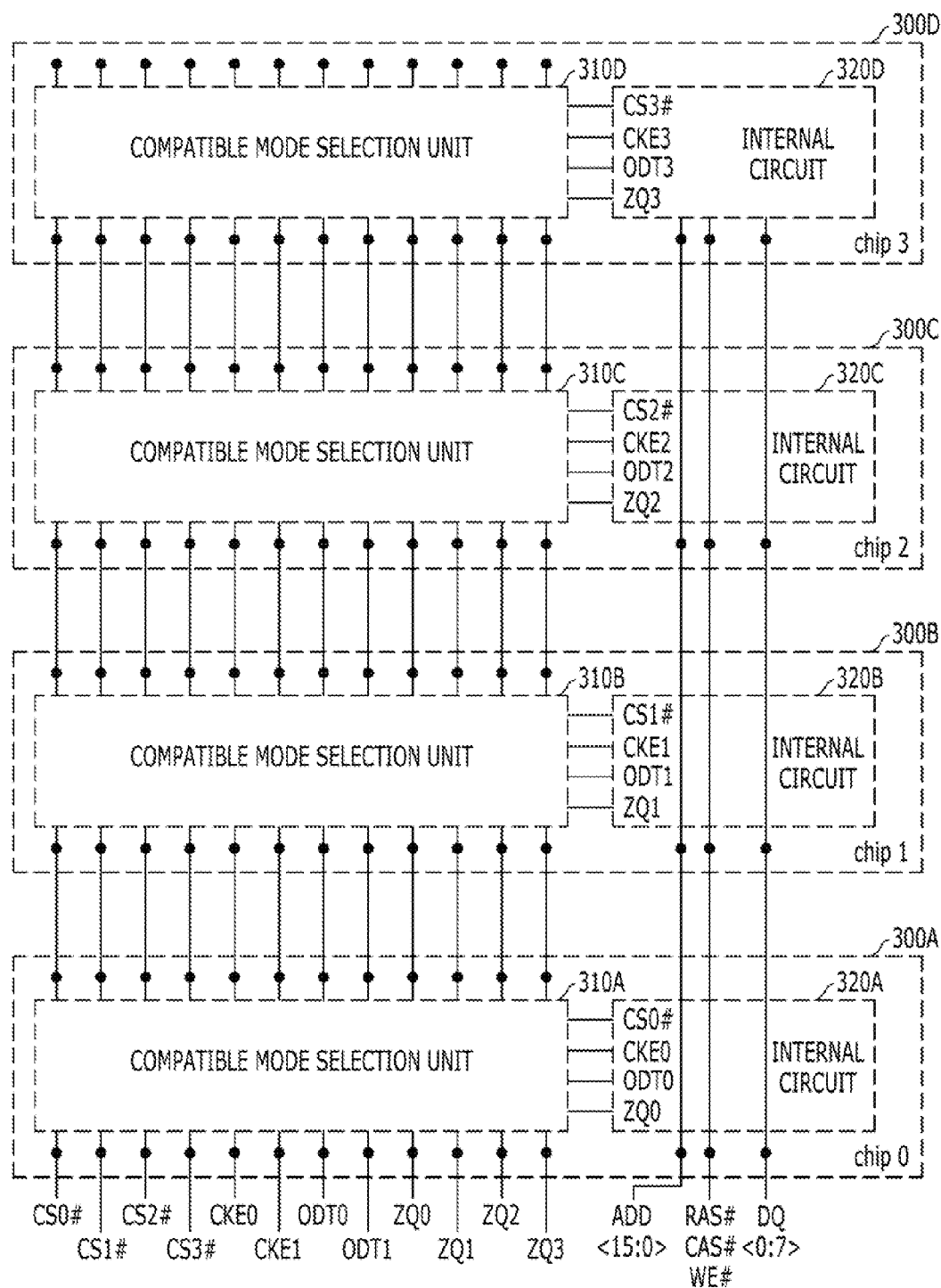
FIG. 6 is a configuration diagram illustrating an interface connection structure of a QDP in accordance with the embodiment of the present invention.

FIG. 6 is a configuration diagram illustrating an interface connection structure of a QDP in accordance with the embodiment of the present invention.

Referring to FIG. 6, the QDP includes a first semiconductor chip 300A connected to an external controller (not illustrated), second semiconductor chip 300B, a third semiconductor chip 300C, and fourth semiconductor chip 3000, which are stacked vertically over the first semiconductor chip 300A. The first to fourth semiconductor chips 300A to 300D include compatible mode selection units 310A to 310D and internal circuits 320A to 320D, respectively. The compatible mode selection units 310A to 310D are configured to selectively output only chip allocation signals allocated to the first to fourth semiconductor chips 300A to 300D, respectively, among a plurality of chip allocation signals CS0# to CS3# and ZQ0 to ZQ3 inputted through corresponding pads, and selectively output chip group allocation signals allocated to groups to which the first to fourth semiconductor chips 300A to 300D belong, respectively, among a plurality of chip group allocation signals CKE0, CKE1, ODT0, and ODT1 inputted through corresponding pads. The internal circuits 320A to 320D are configured to perform operations in response to the chip allocation signals and the chip group allocation signals, selected by the compatible mode selection units 310A to 310D, respectively. Here, the first semiconductor chip 300A transmits the plurality of chip allocation signals CS0# to CS3# and ZQ0 to ZQ3 and the plurality of chip group allocation signals CKE0, CKE1, ODT0, and ODT1, inputted through the corresponding pads, to corresponding pads of the second semiconductor chip 300B. The second semiconductor chip 300E transmits the plurality of chip allocation signals CS0# to CS3# and ZQ0 to ZQ3 and the plurality of chip group allocation signals CKE0, CKE1, ODT0, and ODT1, inputted through the corresponding pads thereof, to corresponding pads of the third semiconductor chip 300C. The third semiconductor chip 300C transmits the plurality of chip allocation signals CS0# to CS3# and ZQ0 to ZQ3 and the plurality of chip group allocation signals CKE0 CKE1, ODT0, and ODT1, inputted through the corresponding pads thereof, to corresponding pads of the fourth semiconductor chip 300D.

Here, the chip allocation signals refer to signals allocated to each semiconductor chip, for example, the chip select signals CS0# to CS3#, the ZQ calibration control signals ZQ0 to ZQ3, and the like. Furthermore, the chip group allocation signals refer to signals, which are commonly allocated to grouped semiconductor chips, for example, the clock enable signals CKE0 and CKE1, the ODT control signals ODT0 and ODT1, and the like. Hereafter, the chip group allocation signals are referred to as the clock enable signals CKE0 and CKE1, for convenience of description.

The SDP, the DDP, and the QDP having the above-described configurations may include one or more semiconductor chips, and the semiconductor chips have the same configuration regardless of the package types SDP, DDP, and QDP.

Figure 7:
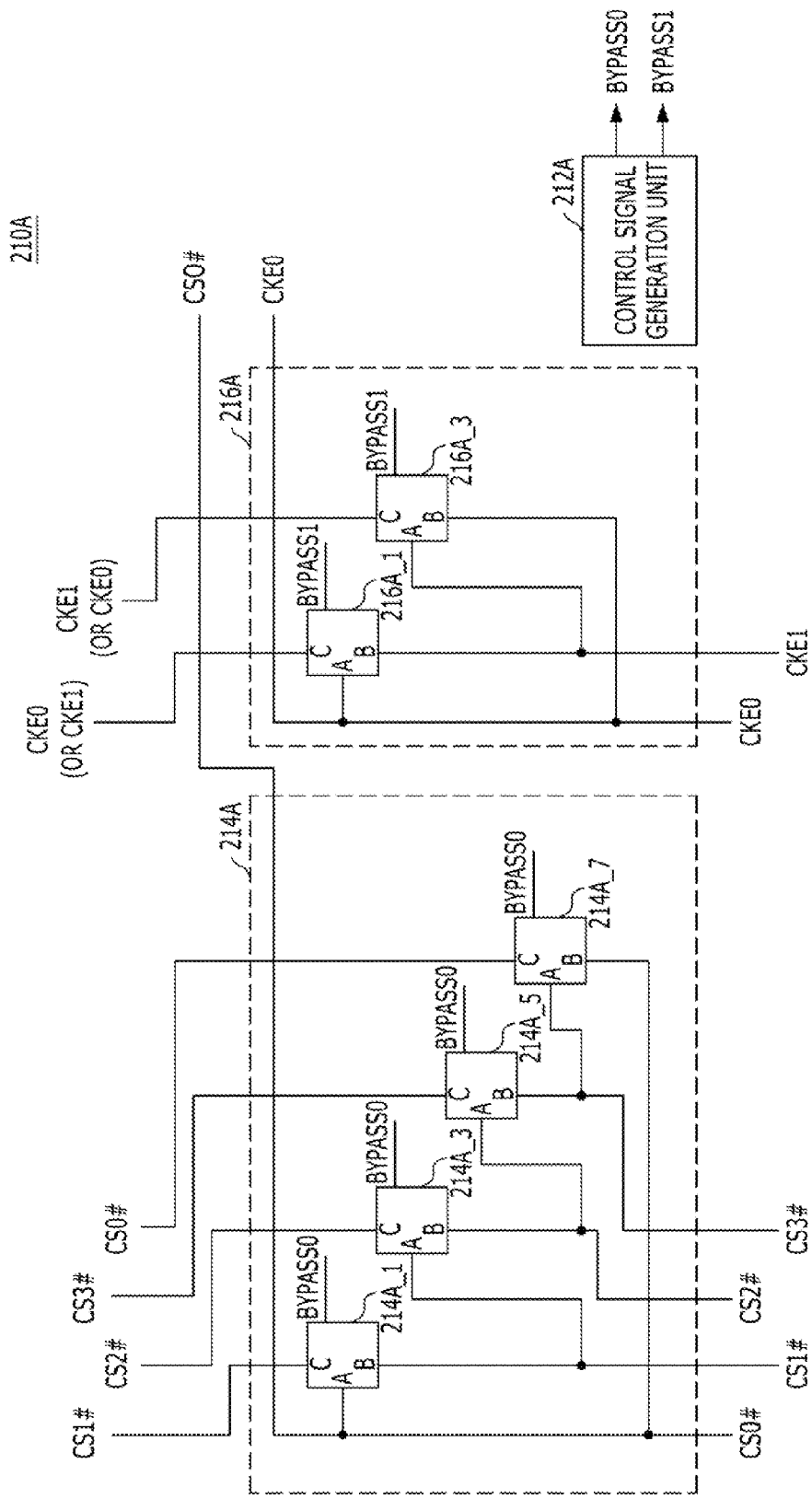
FIG. 7 is a detailed configuration diagram of a compatible mode selection unit included in semiconductor chips illustrated in FIGS. 4 to 6.

FIG. 7 is a detailed configuration diagram of the compatible mode selection units 110, 210A, 210B, and 310A to 310D illustrated in FIGS. 4 to 6.

In this embodiment of the present invention, the compatible mode selection units 110, 210A, 210B, and 310A to 310D illustrated in FIGS. 4 to 6 are designed in the same manner. Therefore, only the compatible mode selection unit 210A illustrated in FIG. 5 will be described representatively, for convenience of description.

Referring to FIG. 7, the compatible mode selection unit 210A includes a control signal generation unit 212A, a first selection unit 214A, and a second selection unit 216A. The control signal generation unit 212A is configured to generate a first control signal BYPASS0 corresponding to stack package information and a second control signal BYPASS1 corresponding to chip grouping information. The stack package information indicates a package type SDP, DDP, or QDP, and the chip grouping information indicates which semiconductor chips are grouped. The first selection unit 214A is configured to directly transmit the first chip select signal CS0# inputted through a pad arranged at one end, among corresponding pads, to the internal circuit 220A, circularly shift the first to fourth chip select signals CS0# to CS3# inputted through the corresponding pads based on the first control signal BYPASS0, and transmit the shifted signals to the respective pads of the stacked semiconductor chip 200B. Here, circularly shifting refers to shifting signals by one pad in one direction. The second selection unit 216A is configured to directly transmit the first clock enable signal CKE0 inputted through a pad arranged at one end, among corresponding pads, to the internal circuit 220A, circularly shift or bypass the first and second clock enable signals CKE0 and CKE1 based on the second control signal BYPASS1, and transmit the shifted or bypassed signals to the respective pads of the second semiconductor chip 200B.

Here, the control signal generation unit 212A may be designed using a fuse circuit for generating the first and second control signals BYPASS0 and BYPASS1 through fuse programming, a decoding circuit for generating the first and second control signals BYPASS0 and BYPASS1 by combining one or more test signals, or a mode register set (MRS) for outputting unallocated codes as the first and second control signals BYPASS0 and BYPASS1.

The first selection unit 214A includes first to fourth multiplexing units 214A_1, 214A_3, 214A_5, and 214A_7 arranged in one-to-one correspondence to the corresponding pads. the first multiplexing unit 214A_1 is configured to receive the first and second chip select signal's CS0# and CS1# inputted through two adjacent pads, and output the second chip select signal CS1# of the first and second chip select signals CS0# and CS1# to a first pad of the corresponding pads of the second semiconductor chip 200B in response to the first control signal BYPASS0. The second multiplexing unit 214A_3 is configured to receive the second and third chip select signals CS1# and CS2# inputted through two adjacent pads, and output the third chip select signal CS2# of the second and third chip select signals CS1# and CS2# to a second pad of the corresponding pads of the second semiconductor chip 200B in response to the first control signal BYPASS0. The third multiplexing unit 214A is configured to receive the third and fourth chip select signals CS2# and CS3# inputted through two adjacent pads, and output the fourth chip select signal CS3# of the third and fourth chip select signals CS2# and CS3# to a third pad of the corresponding pads of the second semiconductor chip 200B in response to the first control signal BYPASS0. The fourth multiplexing unit 214A_7 is configured to receive the fourth and first chip select signals CS3# and CS0# inputted through two pads arranged at both ends, and output the first chip select signal CS0# of the fourth and first chip select signals CS3# and CS0# to a fourth pad of the corresponding pads of the second semiconductor chip 200B in response to the first control signal BYPASS0.

The second selection unit 216A includes fifth and sixth multiplexing units 216A_1 and 216A_3 arranged in one-to-one correspondence to the corresponding pads. The fifth multiplexing unit 216A_1 is configured to receive the first and second clock enable signals CKE0 and CKE1 inputted through two adjacent pads, and output any one of the inputted first and second clock enable signals CKE0 and CKE1 to a first pad of the corresponding pads of the second semiconductor chip 200B in response to the second control signal BYPASS1. The sixth multiplexing unit 216A_3 is configured to receive the second and first clock enable signals CKE1 and CKE0 inputted through two adjacent pads, and output any one of the inputted second and first clock enable signals CKE1 and CKE0 to a second pad of the corresponding pads of the second semiconductor chip 200B in response to the second control signal BYPASS1.

Figure 8:
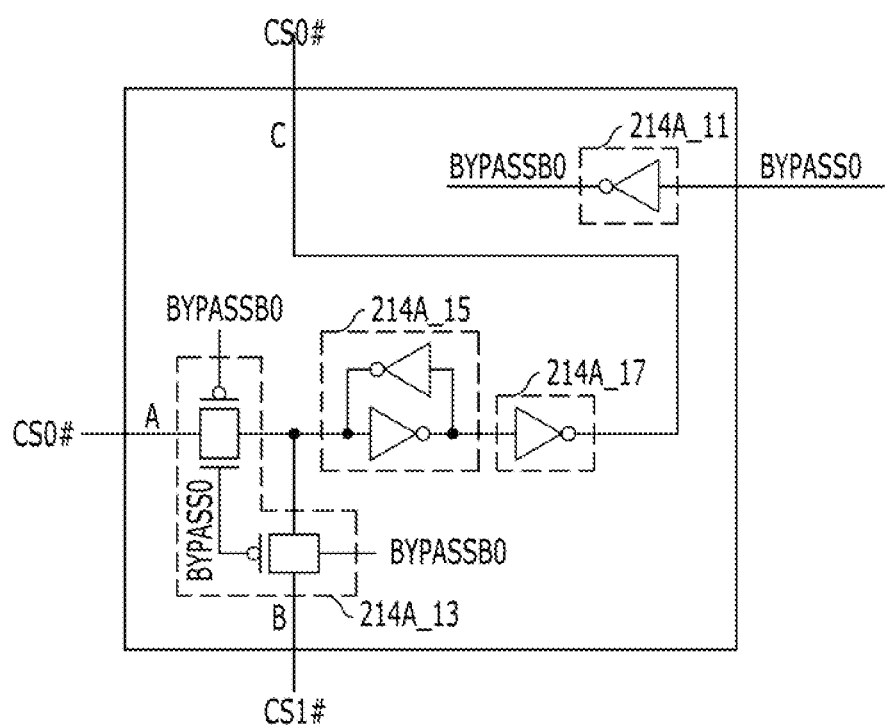
FIG. 8 is a detailed circuit diagram illustrating multiplexing units illustrated in FIG. 7.

FIG. 8 is a detailed circuit diagram of the first to sixth multiplexing units 214A_1, 214A_3, 214A_5, 214A_7, 216A_1, 216A_3 illustrated in FIG. 7.

In this embodiment of the present invention, since the first and sixth multiplexing units 214A_1, 214A_3, 214A_5, 214A_7, 216A_1, 216A_3 have the same configuration, only the first multiplexing unit 214A_1 will be described representatively.

Referring to FIG. 8, the first multiplexing unit 214A_1 includes an inverting section 214A_11, a path selecting section 214A_13, a latch section 214A_15, and an output section 214A_17. The inverting section 214A_11 is configured to invert the first control signal BYPASS0 and output an inverted first control signal BYPASSB0. The path selecting section 214A_13 is configured to select any one of the first and second chip select signals CS0# and CS1# in response to the first control signal BYPASS0 and the inverted first control signal BYPASSB0. The latch section 214A_15 is configured to latch an output signal of the path selecting section 214A_13. The output section 214A_17 is configured to invert and output the signal latched in the latch section 214A_15.

Hereafter, a method for driving the semiconductor integrated circuit in accordance with the embodiment of the present invention will be described.

The method for driving the semiconductor integrated circuit in accordance with the embodiment of the present invention includes a step of fabricating the semiconductor chips 100, 200A, 200B, and 300A to 300D using the same mask process, regardless the package types SDP, DDP, and QDP, a step of setting the first and second control signals BYPASS0 and BYPASS1 generated from the respective control circuits included in the semiconductor chips 100, 200A, 200B, and 300A to 300D, based on the stack package information and the chip grouping information, and a step in which, when the first to fourth chip select signals CS0# to CS3# or the first and second clock enable signals CKE0 and CKE1 are applied externally, the first and second selection circuits included in the semiconductor chips 100, 200A, 200B, and 300A to 300D, respectively, interface the first to fourth chip select signals CS0# to CS3# or the first and second clock enable signals CKE0 and CKE1 among the semiconductor chips in response to the first and second control signals BYPASS0 and BYPASS 1.

The step of setting the signals may be performed in both a wafer state and a package state.

The step of interfacing the signals among the semiconductor chips will be described with reference to FIGS. 9 to 12B. In order not to distract the purpose of the present invention, the following descriptions will be focused on the operations of the DDP and the QDP.

Figure 9:
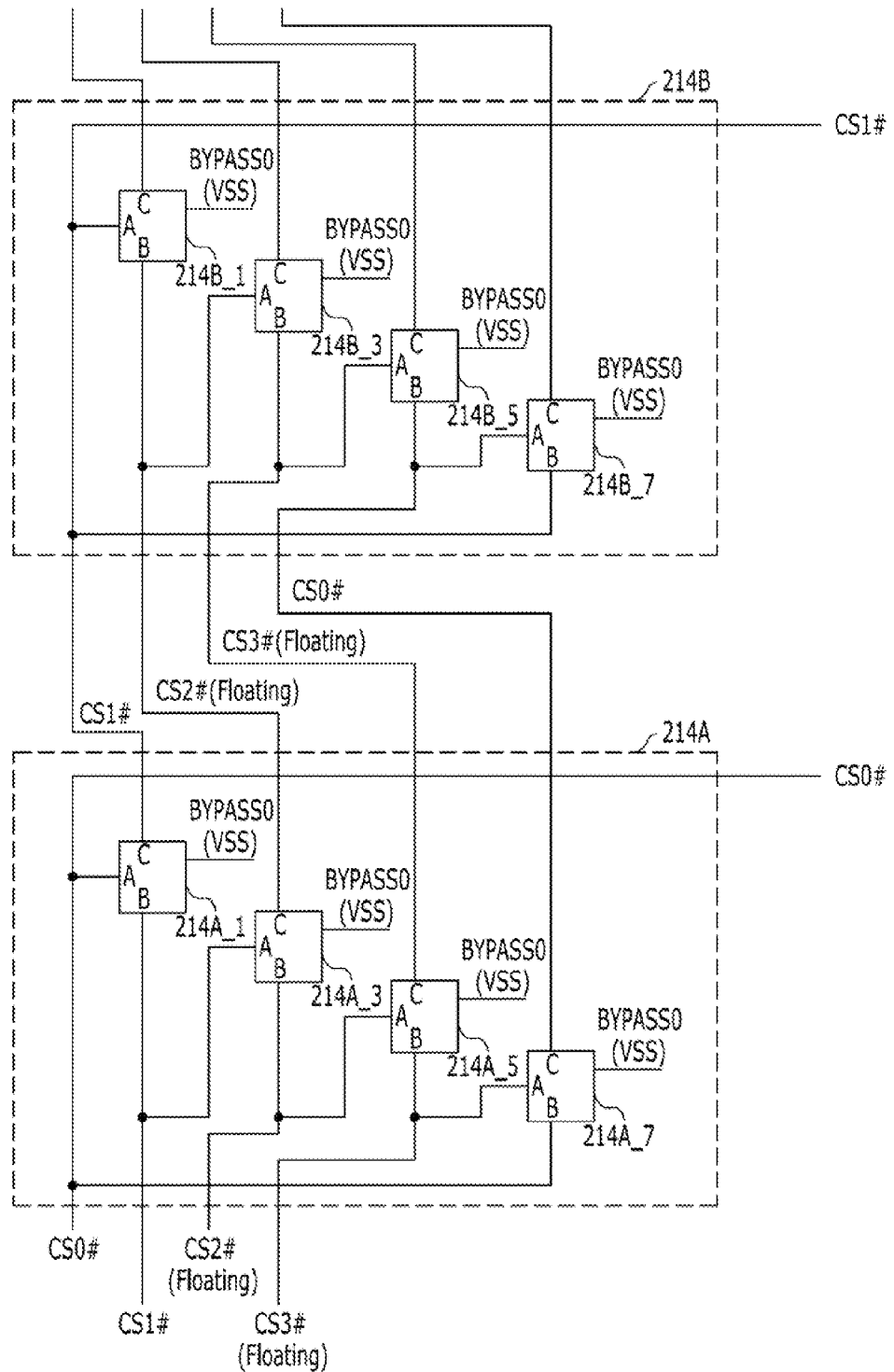
FIG. 9 is a diagram illustrating a process of interfacing chip allocation signals between the semiconductor chips in the operation of the DDP illustrated in FIG. 5.

FIG. 9 is a diagram for explaining the process of interfacing the first to fourth chip select signals CS0# to CS3# between the first and second semiconductor chips 200A and 200B in the operation of the DDP illustrated in FIG. 5.

Referring to FIG. 9, the control signal generation units 212A and 212B included in the first and second semiconductor chips 200A and 200B, respectively, output the first control signal BYPASS0 at a logic low level in response to the stack package information indicating the DDP. In other words, the first control signal BYPASS0 is set at a logic low level in correspondence to the DDP. The setting process may be performed using a fuse program method, a decoding method of combining test mode signals, or a method of using codes unallocated to an MRS, for example.

Meanwhile, the first selection unit 214_A included in the first semiconductor chip 220A directly transmits the first chip select signal CS0# inputted through the first pad of the corresponding pads to the internal circuit 220A, circularly shifts the first to fourth chip select signals CS0# to CS3# inputted through the corresponding pads according to the first control signal BYPASS0, and transmits the shifted signals to the respective pads of the second semiconductor chips 200B. Here, the shifting process will be described in more detail. The first multiplexing unit 214A_1 outputs the second chip select signal CS1# of the first and second chip select signals CS0# and CS1# to the first pad of the corresponding pads of the second semiconductor chip 200B in response to the first control signal BYPASS0. The second multiplexing unit 214A_3 outputs the third chip select signal CS2# of the second and third chip select signals CS1# and CS2# to the second pad of the corresponding pads of the second semiconductor chip 200B in response to the first control signal BYPASS0. The third multiplexing unit 214_5 outputs the fourth chip select signal CS3# of the third and fourth chip select signals CS2# and CS3# to the third pad of the corresponding pads of the second semiconductor chip 200B in response to the first control signal BYPASS0. The fourth multiplexing unit 214A_7 outputs the first chip select signal CS0# of the fourth and first chip select signals CS3# and CS0# to the fourth pad of the corresponding pads of the second semiconductor chip 200B in response to the first control signal BYPASS0.

Then, the first selection unit 214B included in the second semiconductor chip 200B directly transmits the second chip select signal CS1# inputted through the first pad of the corresponding pads to the internal circuit 220B.

Accordingly, the internal circuits 220A and 220B included in the first and second semiconductor chips 220A and 220B, respectively, perform a given operation in response to the first or second chip select signal CS0# or CS1#.

For reference since the DDP includes two semiconductor chips 200A and 200B, the first and second chip select signals CS0# and CS1# for selecting the first and second semiconductor chips 200A and 200B are normally applied through the corresponding pads of the first semiconductor chip 200A, and the pads receiving the third and fourth chip select signals CS2# and CS3#, among the corresponding pads of the first semiconductor chip 200A, are floated.

Figure 10A:
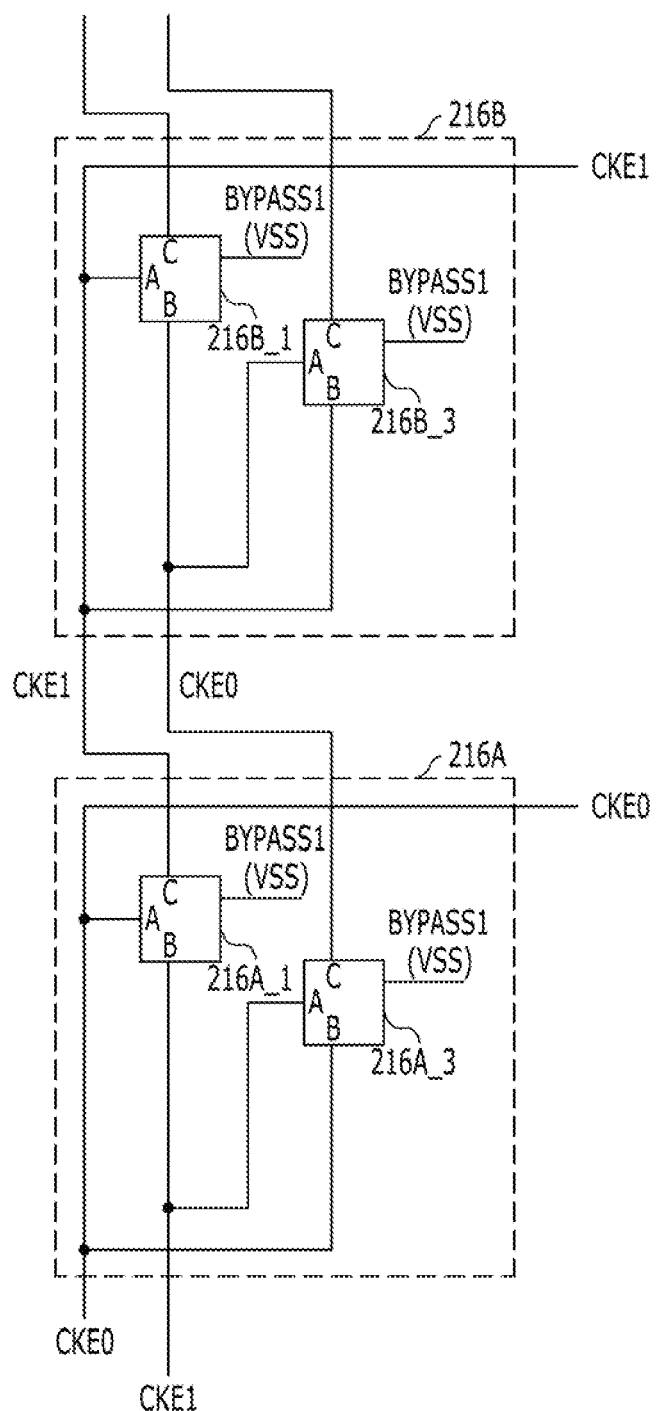
FIGS. 10A and 10B are diagrams illustrating a process of interfacing chip group allocation signals between the semiconductor chips in the operation of the DDP illustrated in FIG. 5.
Figure 10B:
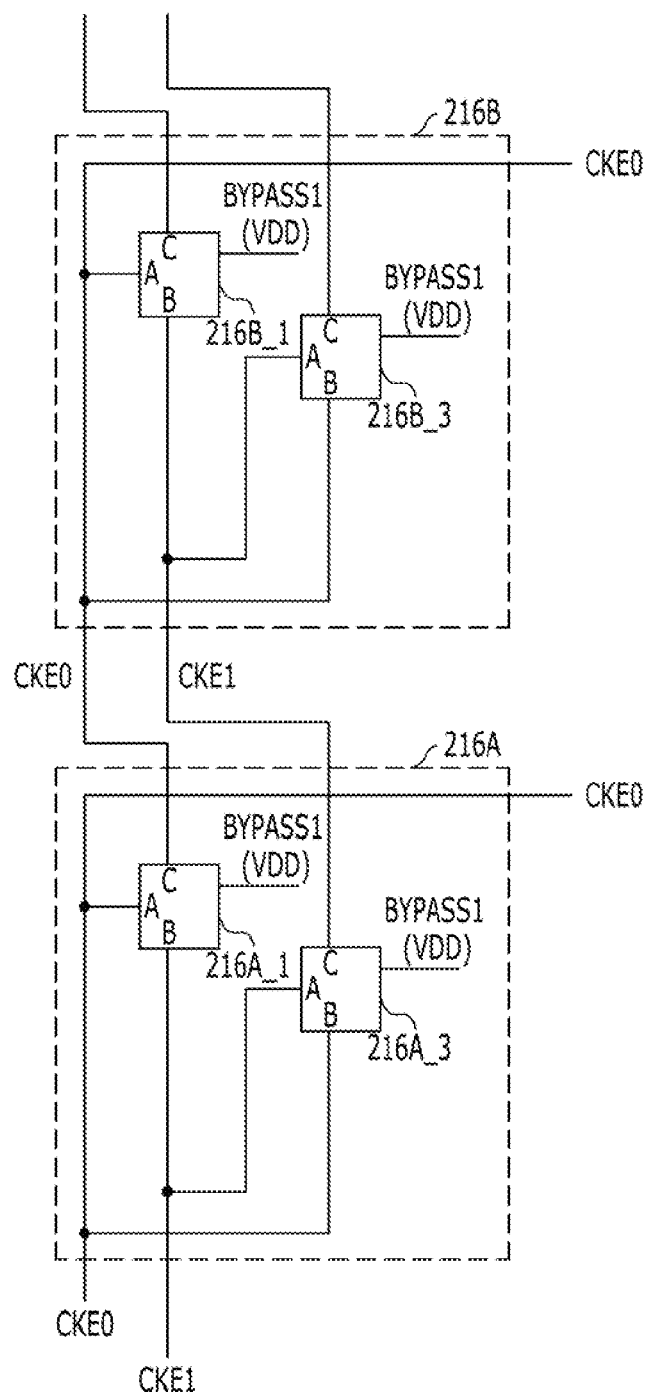

FIGS. 10A and 10B are diagrams illustrating the process of interfacing the first and second clock enable signals CKE0 and CKE1 between the first and second semiconductor chips 200A and 200B in the operation of the DDP.

First, a case in which the first and second semiconductor chips 200A and 200B belonging to different chip groups will be described.

Referring to FIG. 10A, the control signal generation units 212A and 212B included in the first and second semiconductor chips 200A and 200B respectively, output the second control signal BYPASS1 at a logic low level in response to the chip grouping information indicating which semiconductor chips are grouped. In other words, as the first and second semiconductor chips 200A and 200B belong to different groups, the second control signal BYPASS1 is set to a logic low level. The setting process may be performed using a fuse program method, a decoding method of combining test mode signals, or a method of using codes unallocated to an MRS, for example.

Meanwhile, the second selection unit 216A included in the first semiconductor chip 200A directly transmits the first clock enable signal CKE0 inputted through the first pad of the corresponding pads to the internal circuit 220A, circularly shifts the first and second clock enable signals CKE0 and CKE1 inputted through the corresponding pads according to the second control signal BYPASS1, and transmits the shifted signals to the respective pads of the second semiconductor chip 200B. Here, the shifting process will be described in more detail. The fifth multiplexing unit 216A_1 outputs the second clock enable signal CKE1 of the second and first clock enable signals CKE1 and CKE0 to the first pad of the corresponding pads of the second semiconductor chip 200B in response to the second control signal BYPASS1. The sixth multiplexing unit 216A_3 outputs the first clock to enable signal CKE0 of the first and second clock enable signals CKE0 and CKE1 to the second pad of the corresponding pads of the second semiconductor chip 200B in response to the second control signal BYPASS1.

Then the second selection unit 216B included in the second semiconductor chip 200B directly transmits the second clock enable signal CKE1 inputted through the first pad of the corresponding pads to the internal circuit 220B.

Accordingly, the internal circuits 220A and 220B included in the first and second semiconductor chips 200A and 200B, respectively, perform a given operation in response to the first or second clock enable signal CKE0 or CKE1.

Next, a case in which the first and second semiconductor chips 200A and 200B belong to the same chip group will be described.

Referring to FIG. 106, the control signal generation units 212A and 212B included in the first and second semiconductor chips 200A and 200B, respectively, output the second control signal BYPASS1 at a logic high level in response to the chip grouping information indicating which semiconductor chips are grouped. In other words, as the first and second semiconductor chips 200A and 200B belong to the same group, the second control signal BYPASS1 is set at a logic high level. The setting process may be performed using a fuse program method, a decoding method of combining test mode signals, or a method of using codes unallocated to an MRS, for example.

Meanwhile, the second selection unit 216A included in the first semiconductor chip 200A directly transmits the first clock enable signal CKE0 inputted through the first pad of the corresponding pads to the internal circuit 220A. The second selection unit 216A then bypasses the first and second clock enable signals CKE0 and CKE1 inputted through the corresponding pads based on the second control signal BYPASS1, and transmits the bypassed signals to the respective pads of the second semiconductor chip 200B. Here, the bypassing process will be described in more detail. The fifth multiplexing unit 216A_1 outputs the first clock enable signal CKE0 of the first and second clock signals CKE0 and CKE1 to the first pad of the corresponding pads of the second semiconductor chip 200B in response to the second control signal BYPASS1. The sixth multiplexing unit 216A_3 outputs the second clock enable signal CKE1 of the first and second clock signals CKE0 and CKE1 to the second pad of the corresponding pads of the second semiconductor chip 200B in response to the second control signal BYPASS1.

Then, the second selection unit 216B included in the second semiconductor chip 200B directly transmits the first clock enable signal CKE0 inputted through the first pad of the corresponding pads to the internal circuit 220B.

Accordingly, the internal circuits 220A and 220B included in the first and second semiconductor chips 200A and 200B, respectively, perform a given operation in response to the first clock enable signal CKE0.

Figure 11:
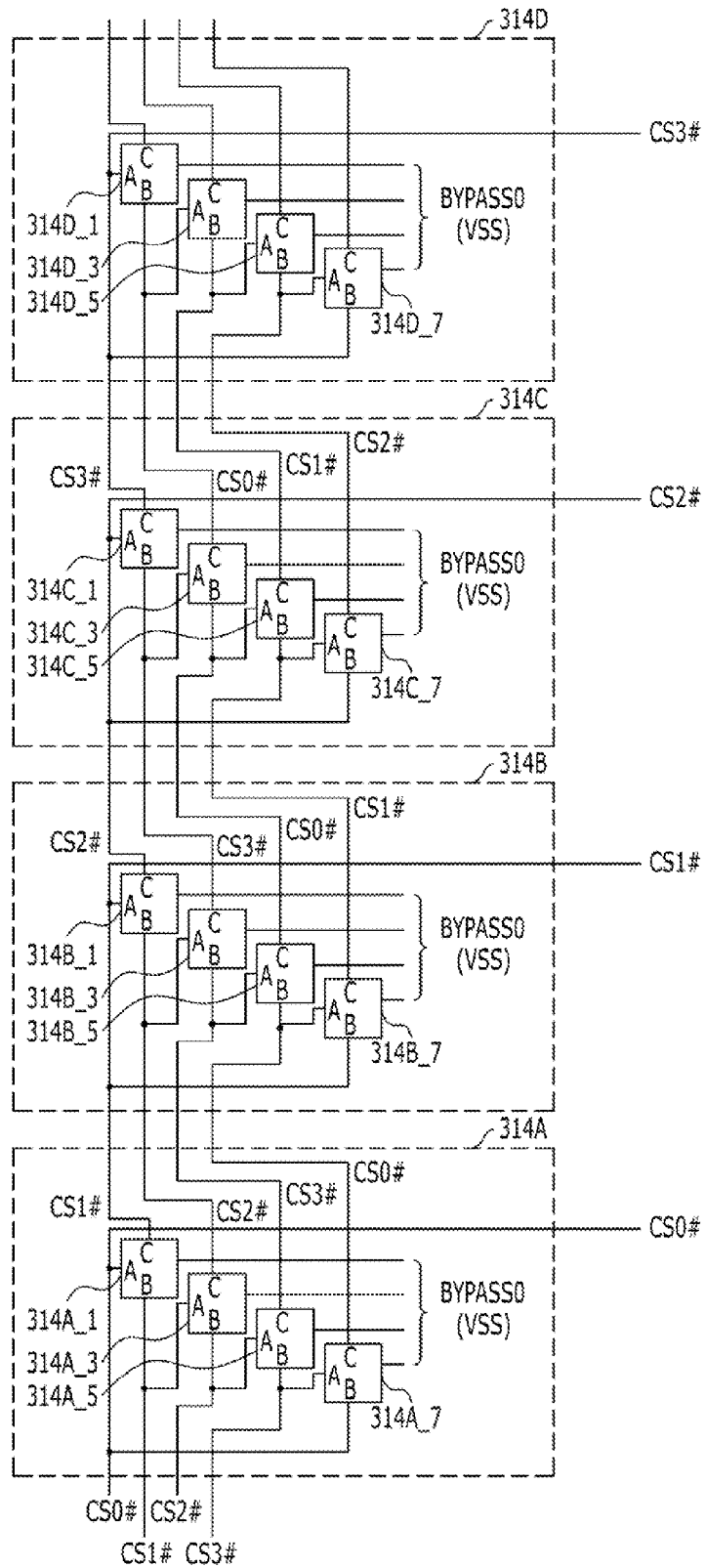
FIG. 11 is a diagram illustrating a process of interfacing chip allocation signals among semiconductor chips in the operation of the QDP illustrated in FIG. 6.

FIG. 11 is a diagram illustrating the process of interfacing the first to fourth chip select signals CS0# to CS3# among the first to fourth semiconductor chips 300A to 300D in the operation of the QDP illustrated in FIG. 6.

Referring to FIG. 11, the control signal generation units included in the first to fourth semiconductor chips 300A to 300D, respectively, output the first control signal BYPASS° at a logic low level in response to the stack package information indicating the QDP. In other words, the first control signal BYPASS0 is set at a logic low lever in correspondence to the QDP. The setting process may be performed using a fuse program method, a decoding method of combining test mode signals, or a method of using codes unallocated to an MRS, for example.

Meanwhile, the first selection unit 314A included in the first semiconductor chip 300A directly transmits the first chip select signal CS0# inputted through the first pad of the corresponding pads to the internal circuit 320A, circularly shifts the first to fourth chip select signal CS0# to CS3# inputted through the corresponding pads according to the first control signal BYPASS0, and transmits the shifted signals to the respective pads of the second semiconductor chip 300B. Here, the shifting process will be described in more detail. The first multiplexing unit 314A_1 outputs the second chip select signal CS1# of the first and second chip select signals CS0# and CS1# to the first pad of the corresponding pads of the second semiconductor 300B in response to the first control signal BYPASS°. The second multiplexing unit 314A_3 outputs the third chip select signal CS2# of the second and third chip select signals CS1# and CS2# to the second pad of the corresponding pads of the second semiconductor 300B in response to the first control signal BYPASS0. The third multiplexing unit 314A_5 outputs the fourth chip select signal CS3# of the third and fourth chip select signals CS2# and CS3# to the third pad of the corresponding pads of the second semiconductor 300B in response to the first control signal BYPASS0. The fourth multiplexing unit 314A_7 outputs the first chip select signal CS0# of the fourth and first chip select signals CS3# and CS0# to the fourth pad of the corresponding pads of the second semiconductor 300B in response to the first control signal BYPASS0.

Then, the first selection unit 314B included in the second semiconductor chip 300B directly transmits the second chip select signal CS1# inputted through the first pad of the corresponding pads to the internal circuit 320B, circularly shifts the second to fourth chip select signals CS1# to CS3# and the first chip select signal CS0# inputted through the corresponding pads based on the first control signal BYPASS0, and transmits the shifted signals to the respective pads of the third semiconductor chip 300C. Here, the shifting process will be described. The first multiplexing unit 314B_1 outputs the third chip select signal CS2# of the second and third chip select signals CS1# and CS2# to the first pad of the corresponding pads of the third semiconductor 300C in response to the first control signal BYPASS°. The second multiplexing unit 314B_3 outputs the fourth chip select signal CS3# of the third and fourth chip select signals CS2# and CS3# to the second pad of the corresponding pads of the third semiconductor 300C in response to the first control signal BYPASS0. The third multiplexing unit 314B_5 outputs the first chip select signal CS0# of the fourth and first chip select signals CS3# and CS1# to the third pad of the corresponding pads of the third semiconductor 300C in response to the first control signal BYPASS0. The fourth multiplexing unit 314B, outputs the second chip select signal CS1# of the first and second chip select signals CS0# and CS1# to the fourth pad of the corresponding pads of the third semiconductor 300C in response to the first control signal BYPASS0.

Furthermore, the first selection unit 314C included in the third semiconductor chip 300C directly transmits the third chip select signal CS2# inputted through the first pad of the corresponding pads to the internal circuit 320C, circularly shifts the third and fourth chip select signals CS2# and CS3# and the first and second chip select signals CS0# and CS1# inputted through the corresponding pads according to the first control signal BYPASS0, and transmits the shifted signals to the respective pads of the fourth semiconductor chip 300D. Here, the shifting process will be described. The first multiplexing unit 314C_1 outputs the fourth chip select signal CS3# of the third and fourth chip select signals CS2# and CS3# to the first pad of the corresponding pads of the fourth semiconductor 300D in response to the first control signal BYPASS0. The second multiplexing unit 314C_3 outputs the first chip select signal CS0# of the fourth and first chip select signals CS3# and CS0# to the second pad of the corresponding pads of the fourth semiconductor 300D in response to the first control signal BYPASS°. The third multiplexing unit 314C_5 outputs the second chip select signal CS1# of the first and second chip select signals CS0# and CS1# to the third pad of the corresponding pads of the fourth semiconductor 300D in response to the first control signal BYPASS°. The fourth multiplexing unit 314C_7 outputs the third chip select signal CS2# of the second and third chip select signals CS1# and CS2# to the fourth pad of the corresponding pads of the fourth semiconductor 300D in response to the first control signal BYPASS0.

Furthermore, the first selection unit 314D included in the fourth semiconductor chip 300D directly transmits the fourth chip select signal CS3# inputted through the first pad of the corresponding pads to the internal circuit 320D.

Accordingly, the internal circuits 320A to 320D included in the first to fourth semiconductor chips 300A to 300D perform a given operation in response to the respective chip select signals CS0# to CS3#.

Figure 12A:
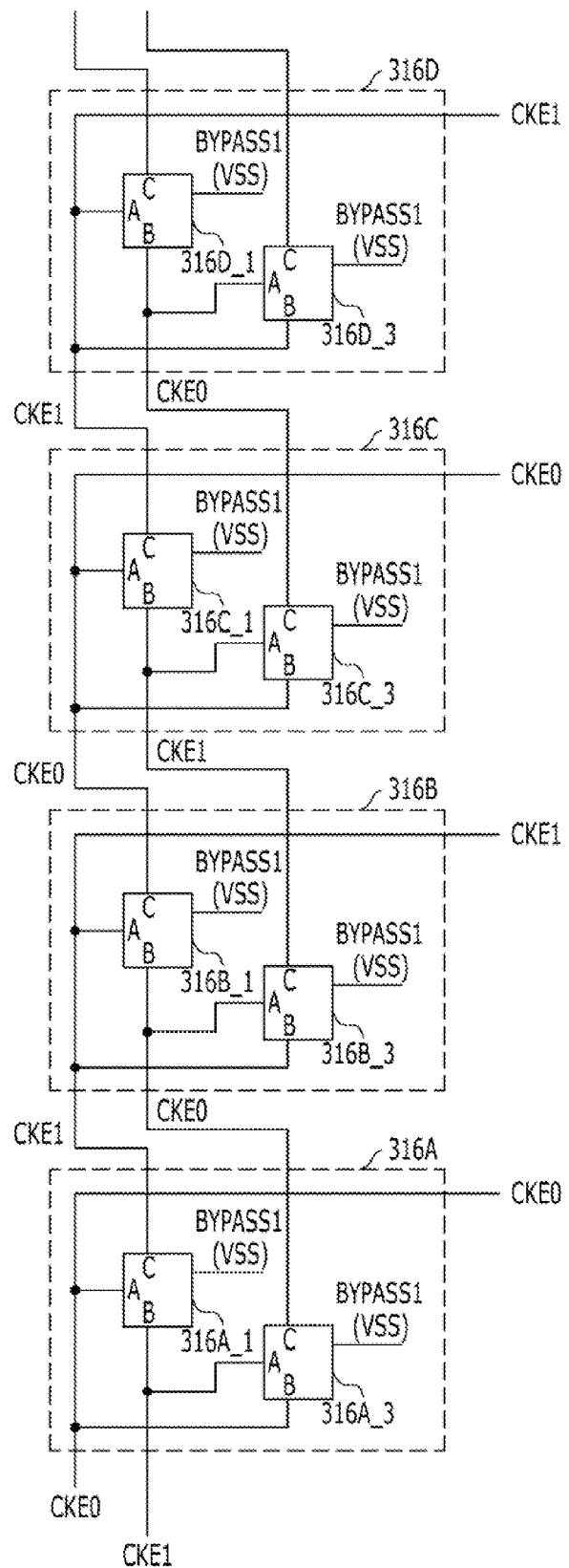
FIGS. 12A and 12B are diagrams illustrating a process of interfacing chip group allocation signals among the semiconductor chips in the operation of the QDP.
Figure 12B:
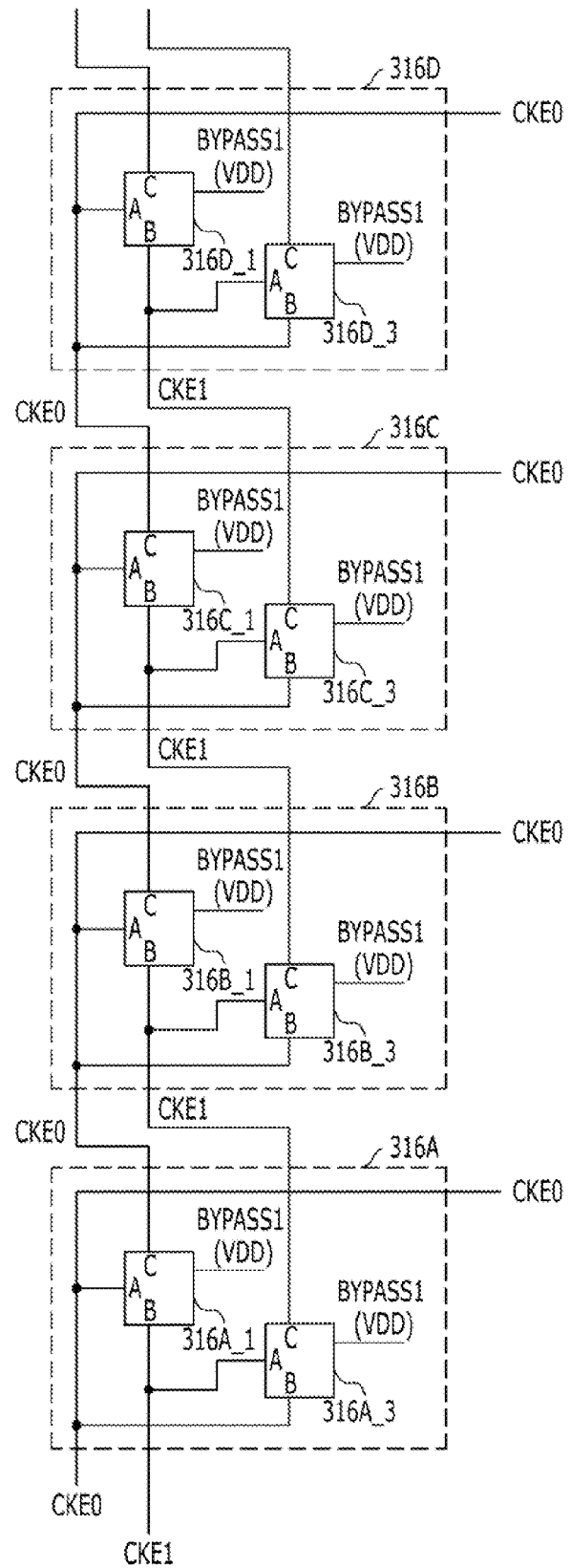

FIGS. 12A and 12B are diagrams for illustrating the process of interfacing the first and second clock enable signals CKE0 and CKE1 among the first to fourth semiconductor chips 300A to 300D in the operation of the QDP.

First, a case in which the first and third semiconductor chips 300A and 300C belong to the same chip group and the second and fourth semiconductor chips 300B and 300D belong to the same chip group will be described.

Referring to FIG. 12A, the control signal generation units included in the first to fourth semiconductor chips 300A to 300D, respectively, output the second control signal BYPASS1 at a logic low lever in response to the chip grouping information indicating which semiconductor chips are grouped. In other words, as the first and third semiconductor chips 300A and 300c belong to the same chip group, and the second and fourth semiconductor chips 300B and 300D belong to the same chip group, the second control signal BYPASS1 is set at a logic low level. The setting process may be performed using a fuse program method, a decoding method of combining test mode signals, or a method of using codes unallocated to an MRS, for example.

Meanwhile, the second selection unit 316A included in the first semiconductor chip 300A directly transmits the first clock enable signal CKE0 inputted through the first pad of the corresponding pads to the internal circuit 320A, circularly shifts the first and second clock enable signals CKE0 and CKE1 inputted through the corresponding pads according to the second control signal BYPASS1, and transmits the shifted signals to the respective pads of the second semiconductor chip 300B. Here, the shifting process will be described in more detail. The fifth multiplexing unit 316A_1 outputs the second clock enable signal CKE1 of the first and second clock enable signals CKE0 and CKE1 to the first pad of the corresponding pads of the second semiconductor chip 3005 in response to the second control signal BYPASS1. The sixth multiplexing unit 316A_3 outputs the first clock enable signal CKE1 of the second and first clock enable signals CKE1 and CKE0 to the second pad of the corresponding pads of the second semiconductor chip 300B in response to the second control signal BYPASS 1.

Furthermore, the second selection unit 3165 included in the second semiconductor chip 300B directly transmits the second clock enable signal CKE1 inputted through the first pad of the corresponding pads to the internal circuit 320B, circularly shifts the second and first dock enable signals CKE1 and CKE0 inputted through the corresponding pads according to the second control signal BYPASS1, and transmits the shifted signals to the respective pads of the third semiconductor chip 300D. Here, the shifting process will be described in more detail. The fifth multiplexing unit 316B_1 outputs the first clock enable signal CKE0 of the second and first clock enable signals CKE1 and CKE0 to the first pad of the corresponding pads of the third semiconductor chip 300C in response to the second control signal BYPASS1. The sixth multiplexing unit 316B_3 outputs the second clock enable signal CKE1 of the first and second clock enable signals CKE0 and CKE1 to the second pad of the corresponding pads of the third semiconductor chip 300C in response to the second control signal BYPASS1.

Furthermore the second selection unit 316C included in the third semiconductor chip 300C directly transmits the first clock enable signal CKE0 inputted through the first pad of the corresponding pads to the internal circuit 320C, circularly shifts the first and second clock enable signals CKE0 and CKE1 inputted through the corresponding pads according to the second control signal BYPASS1 and transmits the shifted signals to the respective pads of the fourth semiconductor chip 300D. Here, the shifting process will be described in more detail. The fifth multiplexing unit 316C_1 outputs the second clock enable signal CKE1 of the first and second clock enable signals CKE0 and CKE1 to the first pad of the corresponding pads of the fourth semiconductor chip 300D in response to the second control signal BYPASS1. The sixth multiplexing unit 316C_3 outputs the first clock enable signal CKE0 of the second and first clock enable signals CKE1 and CKE0 to the second pad of the corresponding pads of the fourth semiconductor chip 300D in response to the second control signal BYPASS1.

Then, the second selection unit 316D included in the fourth semiconductor chip 300D directly transmits the second clock enable signal CKE1 inputted through the first pad of the corresponding pads to the internal circuit 320D.

Accordingly, the internal circuits 320A and 320C included in the first and third semiconductor chips 300A and 300C, respectively, perform a given operation in response to the first clock enable signal CKE0, and the internal circuits 320B and 320D included in the second and fourth semiconductor chips 300B and 300D respectively, perform a given operation in response to the second clock enable signal CKE1.

Next, a case in which the first to fourth semiconductor chips 300A to 300D belong to the same chip group will be described.

Referring to FIG. 12B, the control signal generation units included in the first to fourth semiconductor chips 300A to 300B, respectively, output the second control signal BYPASS1 at a logic high level in response to the chip grouping information indicating which semiconductor chips are grouped. In other words, as the first to fourth semiconductor chips 300A to 300D belong to the same chip group, the second control signal BYPASS1 is set at a logic high level. The setting process may be performed using a fuse program method, a decoding method of combining test mode signals, or a method of using codes unallocated to an MRS, for example.

Meanwhile, the second selection unit 316A included in the first semiconductor chip 300A directly transmits the first clock enable signal CKE0 inputted through the first pad of the corresponding pads to the internal circuit 320A, bypasses the first and second clock enable signals CKE0 and CKE1 inputted through the corresponding pads based on the second control signal BYPASS1, and transmits the bypassed signals to the respective pads of the second semiconductor chip 300B. Here, the bypassing process will be described in more detail. The fifth multiplexing unit 316A_1 outputs the first clock enable signal CKE0 of the first and second clock enable signals CKE0 and CKE1 to the first pad of the corresponding pads of the second semiconductor chip 300B in response to the second control signal BYPASS1. The sixth multiplexing unit 316A_3 outputs the second clock enable signal CKE1 of the second and first clock enable signals CKE1 and CKE0 to the second pad of the corresponding pads of the second semiconductor chip 300B in response to the second control signal BYPASS1.

Furthermore, the second selection unit 316B included in the second semiconductor chip 300B directly transmits the first clock enable signal CKE0 inputted through the first pad of the corresponding pads to the internal circuit 320B, bypasses the first and second dock enable signals CKE0 and CKE1 inputted through the corresponding pads according to the second control BYPASS1, and transmits the bypassed signals to the respective pads of the third semiconductor chip 300C. Here, the bypassing process will be described in more detail. The fifth multiplexing unit 316B_1 outputs the first clock enable signal CKE0 of the first and second clock enable signals CKE0 and CKE1 to the first pad of the corresponding pads of the third semiconductor chip 300C in response to the second control signal BYPASS1. The sixth multiplexing unit 316B_3 outputs the second clock enable signal CKE1 of the second and first clock enable signals CKE1 and CKE0 to the second pad of the corresponding pads of the third semiconductor chip 300C in response to the second control signal BYPASS1.

Furthermore, the second selection unit 316C included in the third semiconductor chip 300C directly transmits the first clock enable signal CKE0 inputted through the first pad of the corresponding pads to the internal circuit 320C, bypasses the first and second clock enable signals CKE0 and CKE1 inputted through the corresponding pads according to the second control BYPASS1, and transmits the bypassed signals to the respective pads of the fourth semiconductor chip 300D. Here, the bypassing process will be described in more detail. The fifth multiplexing unit 316C_1 outputs the first clock enable signal CKE0 of the first and second clock enable signals CKE0 and CKE1 to the first pad of the corresponding pads of the fourth semiconductor chip 300D in response to the second control signal BYPASS1. The sixth multiplexing unit 316C_3 outputs the second clock enable signal CKE1 of the second and first clock enable signals CKE1 and CKE0 to the second pad of the corresponding pads of the fourth semiconductor chip 300D in response to the second control signal BYPASS1.

Then, the second selection unit 316D included in the fourth semiconductor chip 300D directly transmits the first clock enable signal CKE0 inputted through the first pad of the corresponding pads to the internal circuit 320D.

Accordingly, the internal circuits 320A to 320D included in the first to fourth semiconductor chips 300A to 300D, respectively, perform a given operation in response to the first clock enable signal CKE0.

In accordance with the embodiments of the present invention, all of the semiconductor chips stacked in the package may be fabricated through the same mask process regardless of the package types SDP, DDP, and QDP. Therefore, it may be possible to significantly improve the productivity of the semiconductor chips.

While the present invention has been described with respect to the specific embodiments, it will be apparent to those skilled in the art that various changes and modifications may be made without departing from the spirit and scope of the invention as defined in the following claims.

In this embodiment of the present invention, only the SDP, the DDP, and the QDP were taken as examples for description. However, the present invention is not limited thereto, and may be applied to a package in which a larger number of semiconductor chips are stacked, depending on designs.

Furthermore, when the process of interfacing the chip group allocation signals in the operation of the QDP is described, the number of cases in which the first to fourth semiconductor chips are grouped is limited to exemplary cases. However the present invention is not limited thereto, but may be applied to a different number of cases depending on other design considerations.

What is claimed is:

1. A semiconductor integrated circuit comprising a plurality of semiconductor chips stacked therein,
wherein each semiconductor chip comprises:
a compatible mode selection unit configured to transfer a chip allocation signal assigned to the semiconductor chip, among a plurality of chip allocation signals inputted through a plurality of pads, based on stack package information; and an internal circuit configured to perform a given operation in response to the chip allocation signal selected by the compatible mode selection unit, wherein the compatible mode selection unit comprises:

a control signal generation unit configured to generate a control signal corresponding to the stack package information; and a selection unit configured to directly output the assigned chip allocation signal inputted through a pad arranged at one end, among the plurality of pads, to the internal circuit, circularly shift the other chip allocation signals among the plurality of chip allocation signals based on the control signal, and transmit the other chip allocation signals, which are circularly shifted, to corresponding pads included in another semiconductor chip stacked or to be stacked adjacently among the plurality of semiconductor chips.

2. The semiconductor integrated circuit of claim 1, wherein the selection unit includes a plurality of multiplexing units arranged in one-to-one correspondence to the plurality of pads, and each of the multiplexing units receives two chip allocation signals through corresponding pads among the plurality of pads, and outputs any one of the received two chip allocation signals to the semiconductor chip stacked adjacently based on the control signal.

3. The semiconductor integrated circuit of claim 1, wherein the control signal generation unit comprises any one of a fuse circuit, a test mode decoding circuit, and a mode register set (MRS).

4. The semiconductor integrated circuit of claim 1, wherein the plurality of chip allocation signals comprise at least one of a chip select signal and a ZQ calibration signal.

5. A semiconductor integrated circuit comprising a plurality of semiconductor chip stacked therein, wherein each semiconductor chip comprises:

a compatible mode selection unit configured to transfer a signal allocated to a group to which the semiconductor chip belongs, among a plurality of chip group allocation signals inputted through a plurality of pads, based on chip grouping information; and an internal circuit configured to perform a given operation in response to the chip group allocation signal selected by the compatible mode selection unit, wherein the compatible mode selection unit comprises:

a control signal generation unit configured to generate a control signal corresponding to the chip grouping information for grouping given semiconductor groups; and a selection unit configured to directly output a chip group allocation signal inputted through a pad arranged at one end, among the plurality of pads, to the internal circuit, circularly shift or bypass the other chip group allocation signals among the plurality of chip group allocation signals based on the control signal, and transmit the other chip group allocation signals to corresponding pads included in another semiconductor chip stacked or to be stacked adjacently among the plurality of semiconductor chips.

6. The semiconductor integrated circuit of claim 5, wherein the selection unit comprises a plurality of multiplexing units arranged in one-to-one correspondence to the plurality of pads, and each of the multiplexing units receives two chip group allocation signals through corresponding pads, among the plurality of pads, and outputs one of the received two chip group allocation signals in response to the control signal.

7. The semiconductor integrated circuit of claim 5, wherein the control signal generation unit comprises one of a fuse circuit, a test mode decoding circuit, and an MRS.

8. The semiconductor integrated circuit of claim 5, wherein the plurality of chip group allocation signals comprise at least one of a clock enable signal and an on-die termination (ODT) control signal.

9. A semiconductor integrated circuit comprising a plurality of semiconductor chip stacked therein, wherein each semiconductor chip comprises:

a first compatible mode selection unit configured to transfer a chip allocation signal allocated to the semiconductor chip, among a plurality of chip allocation signals inputted through a plurality of first pads, based on a first control signal;

a second compatible mode selection unit configured to select a chip group allocation signal allocated to a group to which the semiconductor chip belongs, among a plurality of chip group allocation signals inputted through a plurality of second pads, based on a second control signal;

an internal circuit configured to perform a given operation in response to the chip allocation signal selected by the first compatible mode selection unit and the chip group allocation signal selected by the second compatible mode selection unit; and a control signal generation unit configured to generate the first control signal corresponding to stack package information and the second control signal corresponding to chip grouping information, wherein the first compatible mode selection unit directly output a chip allocation signal inputted through a first pad arranged at one end, among the plurality of first pads, to the internal circuit, circularly shifts the other chip allocation signals among the plurality of chip allocation signals, and transmits the other chip allocation signals, which are shifted circularly, to corresponding pads included in another semiconductor chip stacked or to be stacked adjacently among the plurality of semiconductor chips.

10. The semiconductor integrated circuit of claim 9, wherein the first compatible mode selection unit comprises a plurality of first multiplexing units arranged in one-to-one correspondence to the plurality of first pads, and each of the first multiplexing units receives two chip allocation signals through corresponding pads among the plurality of first pads, and outputs any one of the received two chip allocation signals in response to the first control signal.

11. The semiconductor integrated circuit of claim 9, wherein the second compatible mode selection unit directly outputs a chip group allocation signal inputted through a second pad arranged at one end, among the plurality of second pads, to the internal circuit, circularly shifts or bypasses the other chip group allocation signals among the plurality of chip group allocation signals according to the second control signal, and transmits the other chip group allocation signals, which are the shifted or bypassed, to corresponding pads included in another semiconductor stacked or to be stacked adjacently among the plurality of semiconductor chips.

12. The semiconductor integrated circuit of claim 11, wherein the second compatible mode selection unit comprises a plurality of second multiplexing units arranged in one-to-one correspondence to the plurality of second pads, and each of the second multiplexing units receives two chip group allocation signals through corresponding pads among the plurality of second pads, and outputs one of the received two chip group allocation signals in response to the second control signal.

13. The semiconductor integrated circuit of claim 9, wherein the control signal generation unit comprises a fuse circuit, a decoding circuit for test mode, and an MRS.

14. The semiconductor integrated circuit of claim 9, wherein the plurality of chip allocation signals comprise at least one of a chip select signal and a ZQ calibration control signal.

15. The semiconductor integrated circuit of claim 9, wherein, the plurality of chip group allocation signals comprise at least one of a clock enable signal and an ODT control signal.

16. The semiconductor integrated circuit of claim 14, wherein, the plurality of chip group allocation signals comprise at least one of a clock enable signal and an ODT control signal.

* * * * *